US007009229B1

(12) United States Patent
Lin et al.

(10) Patent No.: US 7,009,229 B1
(45) Date of Patent: Mar. 7, 2006

(54) ELECTROSTATIC DISCHARGE PROTECTION DEVICE FOR INTEGRATED CIRCUITS

(75) Inventors: Chong Ming Lin, Sunnyvale, CA (US); Ho Yuan Yu, Saratoga, CA (US)

(73) Assignee: Lovoltech, Incorporated, Santa Clara, CA (US)

( * ) Notice: Subject to any disclaimer, the term of this patent is extended or adjusted under 35 U.S.C. 154(b) by 0 days.

(21) Appl. No.: 10/793,077

(22) Filed: Mar. 3, 2004

Related U.S. Application Data

(63) Continuation of application No. 10/279,806, filed on Oct. 23, 2002, now Pat. No. 6,774,417.

(51) Int. Cl.
*H01L 29/80* (2006.01)
(52) U.S. Cl. ..................... 257/287; 257/355
(58) Field of Classification Search .............. 257/287, 257/355, 504; 438/186, 193, 195
See application file for complete search history.

(56) References Cited

U.S. PATENT DOCUMENTS 6,774,417 B1 * 8/2004 Lin et al. .................... 257/287

OTHER PUBLICATIONS

H. Ogiwara, M. Hayakawa, T. Nishimura and M. Nakaoka; "High-Frequency Induction Heating Inverter with Multi-Resonant Mode Using Newly Developed Normally-Off Type Static Induction Transistors"; Department of Electrical Engineering, Ashikaga Institute of Technology, Japan; Department of Electrical Engineering, Oita University, Japan; Department of Electrical Engineering, Kobe University, Japan; pp. 1017-1023.

J. Baliga; "Highvoltage Junction-Gate Field Effect Transistor with Recessed Gates"; IEEE Transactions on Electron Devices; vol. ED-29; No. 10; Oct. 1982.

J.M. C. Stork et al.; "Small Geometry Depleted Base Bipolar Transistors (BSIT)- VLSI Devices?"; IEEE Transactions on Electron Devices; vol. ED-28; No. 11; Nov. 1981.

Nishizawa et al.; "Analysis of Static Characteristics of a Bipolar Mode SIT (BSIT)"; IEEE Transactions on Electron Devices; vol. ED-29; No. 11; Aug. 1982.

Caruso et al.; "Performance Analysis of a Bipolar Mode FET (BMFET) with Normally off Characteristics"; IEEE Transactions on Power Electronics; vol. 3; No. 2; Apr. 1988.

Nishizawa et al.; "Fieldeffect Transistor Versus Analog Transistor (Static Induction Transistor)"; IEEE Transactions on Electron Devices; vol. ED-24; No. 4; Apr. 1975.

* cited by examiner

Primary Examiner—Douglas W. Owens

(57) ABSTRACT

A protection device for integrated circuits. A complementary well is fabricated in a semiconductor substrate. An enhancement mode junction field effect transistor (JFET) is fabricated in the complementary well. An interface bonding pad is fabricated above the JFET. A source contact is also fabricated in the well. The gate and drain of the JFET are coupled to the interface bonding pad and the source of the JFET is coupled to the substrate.

18 Claims, 7 Drawing Sheets

ELECTROSTATIC DISCHARGE PROTECTION DEVICE FOR INTEGRATED CIRCUITS

This application is a continuation of and claims the benefit of application Ser. No. 10/279,806 filed on Oct. 23, 2002, now U.S. Pat. No. 6,774,417.

FIELD OF THE INVENTION

Embodiments of the present invention relate to the field of semiconductor devices. In particular, embodiments of the present invention relate to the protection of semiconductor devices against electrical over-stress (EOS) and electrostatic discharge (ESD).

BACKGROUND ART

Integrated circuits (ICs) are sensitive to electrostatic discharge (ESD) and electrical over-stress (EOS). This is particularly true for ICs that are fabricated using metal-oxide semiconductor (MOS) technology. The thin oxide films used to insulate the gates of MOS transistors have relatively low breakdown voltages, and the individual gates are typically designed to have low capacitance.

In order to protect integrated circuits from ESD damage, protection circuits are frequently integrated on the chip. These protection circuits are usually adjacent to bonding pads where input and output signal leads are attached. Protection is typically provided by switches (e.g. diodes) that open to provide a shunt path to divert the energy of a static discharge into the IC, and/or capacitors that can absorb a static charge and reduce the voltage seen by the rest of the IC.

In the past, silicon p-n junction diodes have been used to clamp spikes at the inherent forward voltage drop of 0.6 to 0.7 volts. However, as smaller transistors are developed and power supply voltages are reduced, diodes that can clamp at a smaller forward voltage are required.

Schottky diodes can be used to provide clamping at forward voltages that are smaller than those of the silicon diode; however, the fabrication of Schottky diodes can increase the complexity of IC processing by requiring an additional metal deposition.

Another difficulty associated with the use of diodes is that in order to protect a signal line from both positive and negative voltages, a pair of diodes must be used, which can create an equivalent silicon controlled rectifier (SCR) structure in bipolar and complementary metal-oxide semiconductor (CMOS) technology that is susceptible to latch-up.

Conventional ESD protection devices in ICs require a part of the available wafer area in order to provide protection. The circuit elements that must be protected from EOS/ESD energy surges are shrinking in size, whereas the energy surges that must be protected against are not.

SUMMARY OF INVENTION

Accordingly, an ESD protection device for integrated circuits that requires no additional wafer area and avoids many of the problems associated with diode protection schemes is described herein.

More specifically, in an embodiment of the present invention, an enhancement mode junction field effect transistor (JFET) is fabricated in a complementary well that is located beneath an interface bonding pad associated with a signal line that is to be protected. The gate and drain of the enhancement mode JFET are connected to the bonding pad, whereas the source of the JFET is coupled to the IC substrate and to a source contact on the complementary well.

In another embodiment of the present invention, the gate of the enhancement mode JFET is fabricated concurrently with other devices in the integrated circuit, thus eliminating the need for additional process steps. Thus, the overhead associated with the addition of the JFET structure is limited to mask features. Since the threshold voltage ($V_{th}$) of the JFET can be adjusted through mask features, different bonding pads on the same chip can be provided with protection devices having different threshold voltages, and the magnitude of the threshold voltage for the JFET can be set below 0.5 volts. Thus, an n-channel JFET may have a threshold voltage less than +0.5 volts, and a p-channel JFET may have a threshold voltage above −0.5 volts.

In a further embodiment, the gate of the enhancement mode JFET is fabricated as a gate grid structure, having multiple channels. The gate grid structure allows the total channel cross-section to be varied independently from the threshold voltage, and can be easily adjusted to match the size of the bonding pad.

DESCRIPTION OF THE PREFERRED EMBODIMENTS

In the following detailed description of the present invention, an electrostatic discharge protection device for integrated circuits, numerous specific details are set forth in order to provide a thorough understanding of the present invention. However, it will be obvious to one skilled in the art that the present invention may be practiced without these specific details. In other instances well known circuits and components have not been described in detail so as not to unnecessarily obscure aspects of the present invention.

U.S. Pat. No. 6,251,716 entitled "JFET Structure and Manufacture Method for Low On-Resistance and Low Voltage Application," issued Jun. 26, 2001, and assigned to the assignee of the present invention, is hereby incorporated herein by reference. The referenced patent describes material regarding an enhancement mode JFET with a gate grid array structure.

U.S. patent applications Ser. No. 10/158,326, "Method and Structure for Reduced Gate Capacitance," (filed May 29, 2002) and Ser. No. 10/191,030 "Method and Structure for Double Dose Gate in a JFET," (filed Jul. 2, 2002), are assigned to the assignee of the present invention and describe gate structures and methods of fabricating same. Both applications are hereby incorporated herein by reference.

Figure 1:
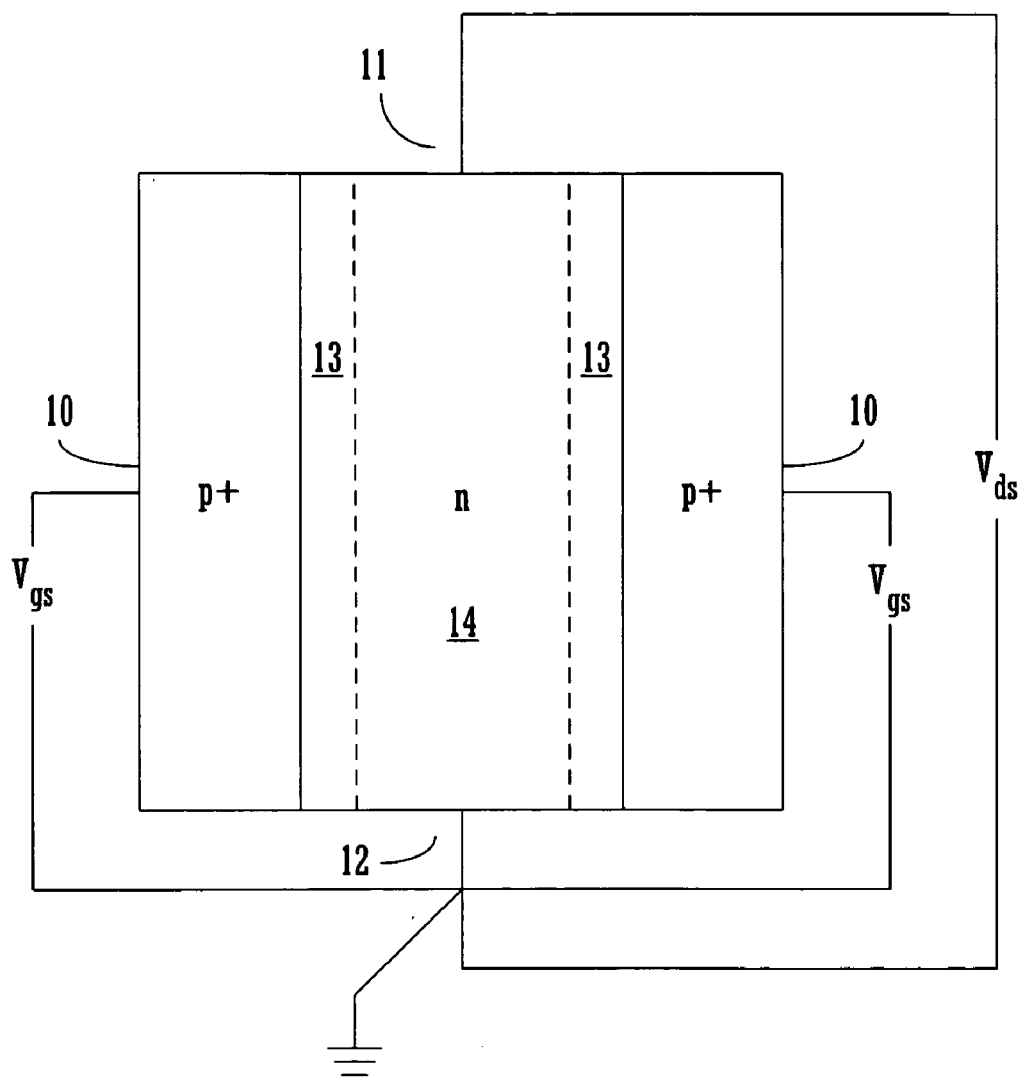
FIG. 1 shows a general schematic for an n-channel depletion mode junction field effect transistor (JFET).

FIG. 1 shows a general schematic for an n-channel depletion mode JFET with $V_{gs}=V_{ds}=0$. The JFET has two opposed gate regions 10, a drain 11 and source 12. The drain 11 and source 12 are located in the n-doped region of the device and the gates 10 are p-doped. Two p-n junctions are present in the device, each having an associated depletion region 13. A conductive channel region 14 is shown between the two depletion regions 13 associated with the p-n junctions. In operation, the voltage variable width of the depletion regions 13 is used to control the effective cross-sectional area the of conductive channel region 14.

The application of a voltage $V_{gs}$ between the gates 10 and source 12 will cause the conductive channel region to vary in width, thereby controlling the resistance between the drain 11 and the source 12. A reverse bias, (e.g., a negative $V_{gs}$), will cause the depletion regions to expand, and at a sufficiently negative value cause the conductive channel to "pinch off", thereby turning off the device.

The width of the depletion regions 13 and the conductive channel region 14 are determined by the width of the n-doped region and the dopant levels in the n-doped and p-doped regions. If the device shown in FIG. 1 were constructed with a narrow n-doped region, such that the two depletion regions merged into a single continuous depletion region and the conductive channel region 14 had zero width, the result would be the device shown in FIG. 2.

Figure 2:
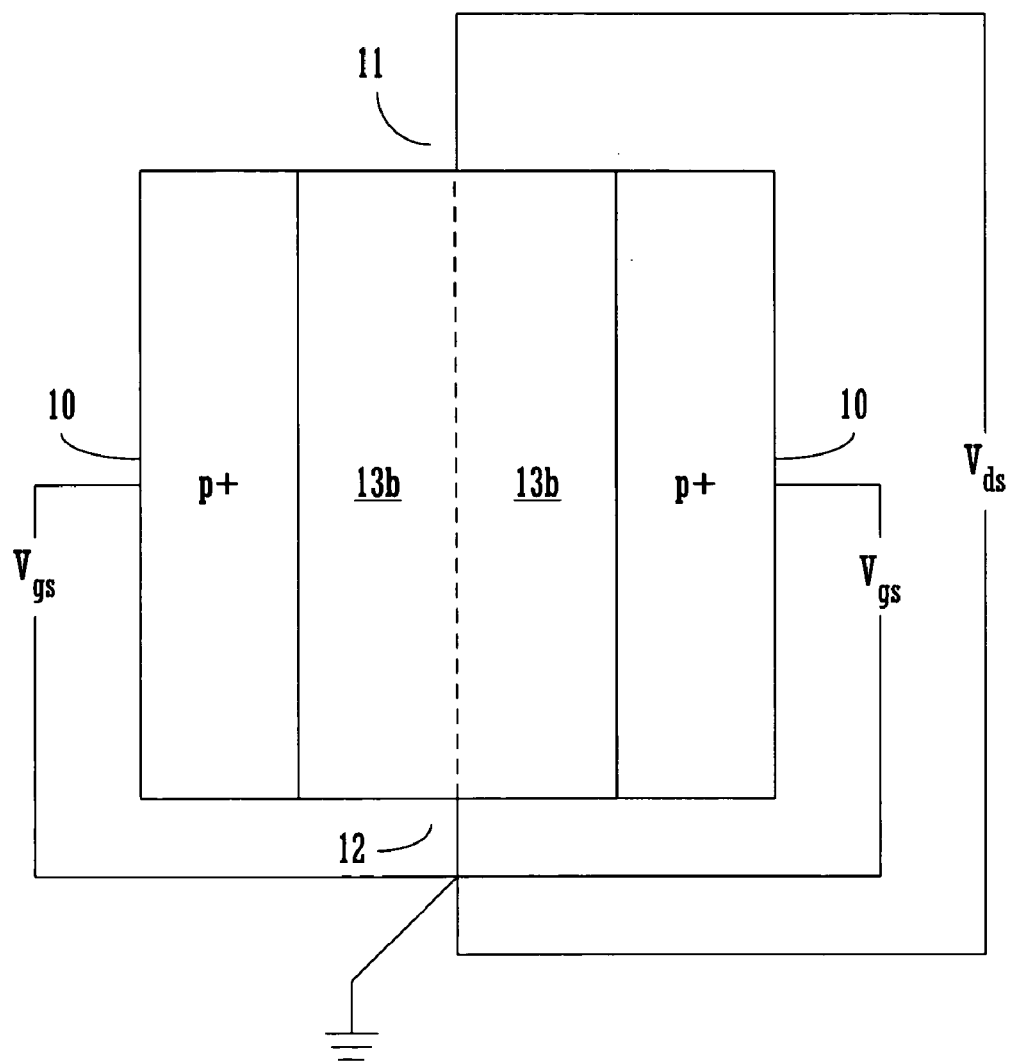
FIG. 2 shows a general schematic for an n-channel enhancement mode junction field effect transistor (JFET)

FIG. 2 shows a general schematic of an n-channel enhancement mode JFET with $V_{gs}=V_{ds}=0$. The enhancement mode device is normally "off" since the conductive channel width is zero due to the extent of the two depletion regions 13B. The application of a sufficient forward bias (e.g. positive $V_{gs}$) to the device of FIG. 2 will cause the depletion regions 13B to contract, thereby opening a conductive channel. Enhancement mode JFETs are far less common than depletion mode JFETs and are generally unavailable as commercial devices. Text books and application notes frequently refer to JFETs as depletion mode devices, ignoring enhancement mode operation.

Although the depletion mode and enhancement mode devices shown schematically in FIG. 1 and FIG. 2 are n-channel devices, depletion mode and enhancement mode devices could be constructed with a reversed doping scheme to provide p-channel devices.

Figure 3:
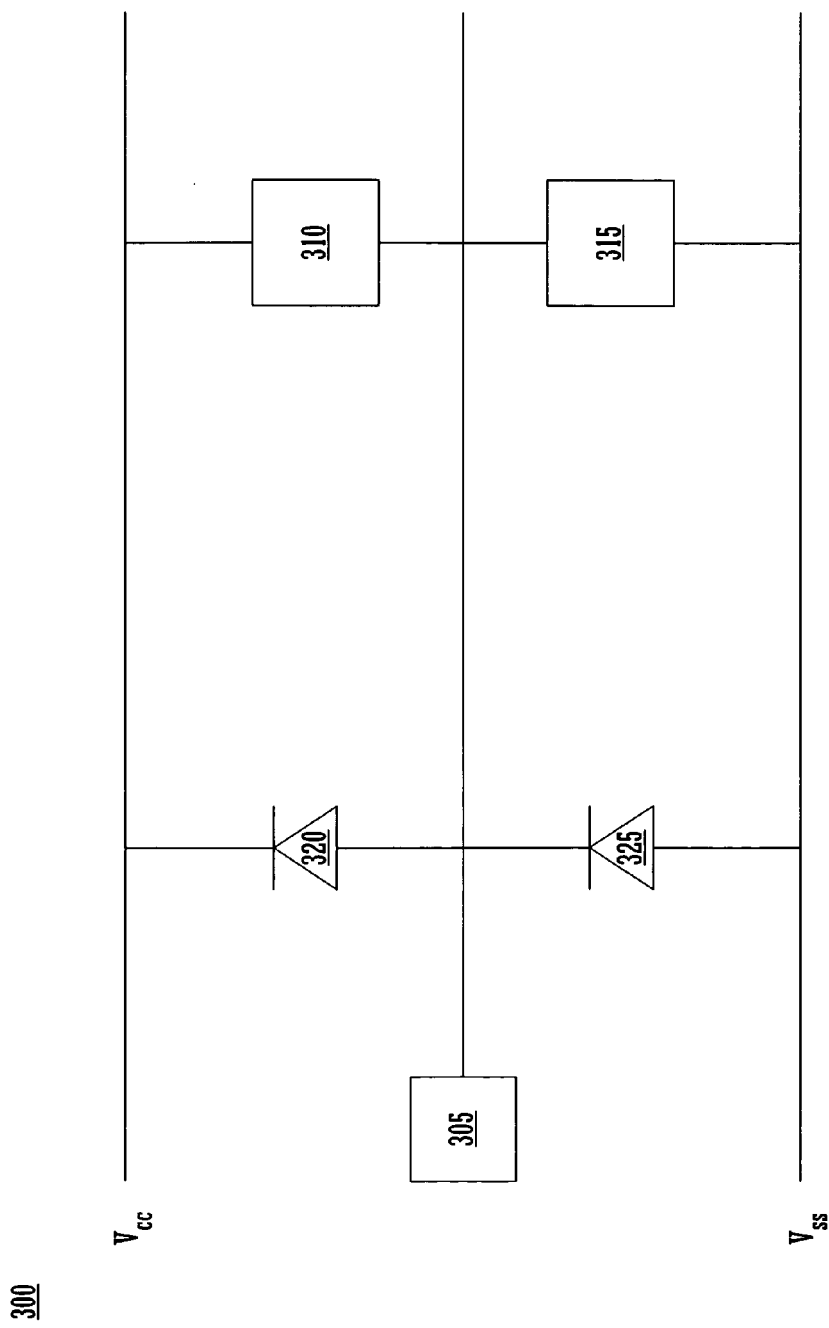
FIG. 3 shows a general schematic of a protection circuit for use in an integrated circuit.

FIG. 3 shows a general schematic 300 of a protection circuit for use in an integrated circuit (IC). A high supply voltage $V_{cc}$ and a low supply voltage $V_{ss}$ are provided to circuits 310 and 315 within the IC. An input or output signal may be coupled to the interface bonding pad 305. For circuit 315 and the parallel diode 325, $V_{ss}$, provides a reference voltage and a sink for current that result when the breakdown voltage of diode 325 is exceeded. Similarly, for circuit 310 and the parallel diode 320, $V_{CC}$ provides a reference voltage and a sink for current that result when the breakdown voltage of diode 320 is exceeded.

Diodes 320 and 325 are representative of shunt switches and may be junction diodes or intrinsic diodes, e.g. drain source diodes of associated with metal-oxide semiconductor field effect transistors (MOSFETs) of circuits 310 and 315. Diodes 320 and 325 as shown are oriented for reverse breakdown and may be fabricated to withstand various types of ESD spike voltages; however, as described above, the minimum switching voltage than can be achieved is about 0.6 to 0.7 volts in a forward orientation using conventional silicon technology.

Normally, diodes 320 and 325 are separated from each other when used with a particular pad 305, since the use of both diodes without proper separation and guard rings in the configuration shown in FIG. 3 could provide a silicon controlled rectifier (SCR) structure that is susceptible to latch-up and damage to the associated circuits.

An example of a typical implementation of the protection scheme of FIG. 3 would be a p-type diode (e.g., $p^+$ contact in an n-well) for diode 320 and an n-type diode (e.g., $n^+$ contact in a p-well).

Figure 4:
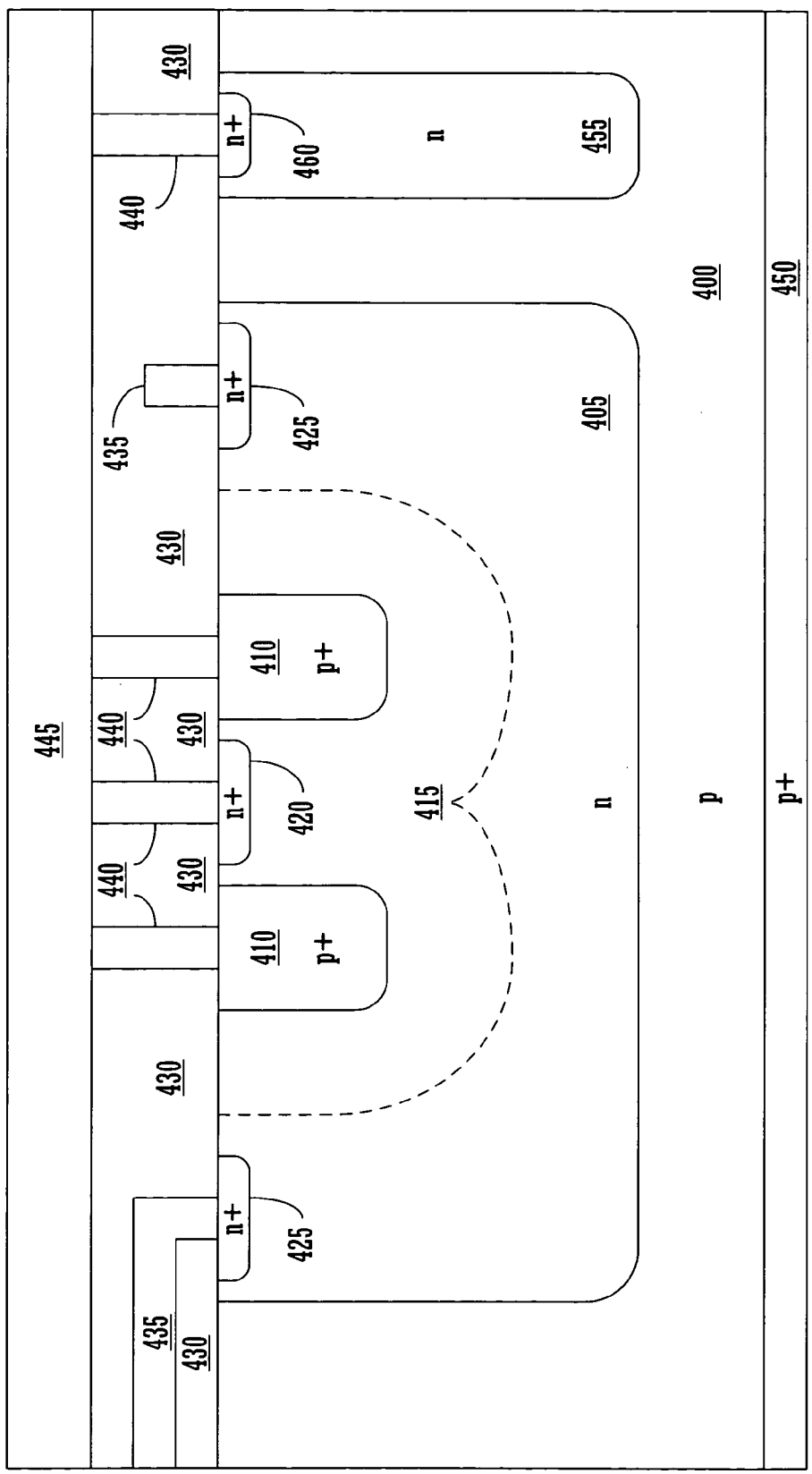
FIG. 4 shows a protection device comprising an n-channel enhancement mode junction field effect transistor (JFET) in accordance with an embodiment of the present claimed invention.

FIG. 4 shows a protection device comprising an n-channel enhancement mode junction field effect transistor (JFET) in accordance with an embodiment of the present claimed invention. An n-type well 405 is fabricated in a p-type substrate 400, such as silicon. Within the well 405, a p-type gate 410 is formed (e.g. by ion implant). An $n^+$ drain contact 420 and an n+ source contact 425 are also formed in the well 405. The source contact 425 is coupled by conductive trace 435 to a current sink (e.g., a supply $V_{cc}$). The substrate 400 may include an optional p+ bottom contact 450.

The term "complementary well" refers to a well formed in a p-type or n-type substrate such that the doping of the well is complementary to the substrate, and a p-n junction exists at the interface between the well and the substrate (e.g. a p-type well in a n-type substrate, or an n-type well in a p-type substrate).

In addition to being coupled to the source contact 425, the source of the JFET is also coupled to the p-n junction that exists at the boundary between the well 405 and the substrate 400. The doping levels and geometry of the gate 410 and drain 420 produce the overlapping depletion regions 415 that are characteristic of the enhanced mode JFET.

A layer of dielectric 430 (e.g. silicon dioxide) provides support and partial electrical isolation for the interface bonding pad 445. The pad 445 is electrically coupled to the gate 410 and drain 420 by contact vias 440, and isolated from the remainder of the well 405. The contact vias 440 are preferably fabricated from a metal that provides an ohmic contact to the gate 410 and source 420. It is also desirable that the composite structure of the contact vias 440 and oxide 430 be sufficiently robust to withstand the stresses applied to the pad 445 during wafer probing and die bonding.

The pad 445 may be a wirebond pad, or it may be a pad on a flip-chip such as those used in ball-grid array (BGA) packages. It is important to note that FIG. 4 is not necessarily illustrative of the proportions between the bonding pad 445, well 405, and the JFET fabricated in the well 405. A rectangular bonding pad may have a length and width measured in tens of microns, whereas the gate 410 and drain contact 420 may be fabricated in an area that is on the order of one micron square. A vertical JFET such as that shown in FIG. 4 is preferred in order to minimize area. In a vertical JFET, the channel is essentially perpendicular to the substrate surface.

When not in operation, the JFET shown in FIG. 4 presents a small capacitive load to the bonding pad 445. This capacitance is essentially the combination of two capacitors in series. The first capacitor is the sum of the capacitance of the oxide 430, and the capacitance between the gate/drain and the well. The second capacitance is the junction capacitance of the well 405. Since the two capacitances are in series, the total capacitance is less than either capacitance. Typically, the second capacitance is larger than the first capacitance, due to the larger area of the well/substrate p-n junction as compared to the gate/well p-n junction.

In addition to well 405, the protection device shown in FIG. 4 includes a an optional second well 455 with a contact 360 and contact via 440 providing a connection to the pad 445. The junction between well 455 and the substrate 400 provides a conventional junction diode that may be combined with the JFET in well 405 to provide bipolar ESD protection. The well 455 may be located beneath the pad 445 (as shown), or it may be outside of the pad 445 and coupled to the pad 445 by a conductive trace.

The protection device of FIG. 4 has two operational modes, depending upon the polarity of the voltage spike that appears at the bonding pad 445. Normally, the substrate 400 will be coupled to the low side supply $V_{ss}$, or ground, and the trace 435 will be coupled to the high side supply, Vcc.

When a negative spike appears at the bonding pad 445, the p-n junction between the well 455 and substrate 400 becomes forward biased, and the voltage at the pad is clamped at the forward voltage of the well/substrate junction.

When a positive spike $V_{sp}$ appears at the bonding pad 445, the p-n junction between the gate 410 and the well 405 is forward biased ($V_{sp} > V_{cc} + V_{th}$), causing the depletion region 415 to contract and open a conductive channel into the well. At this point, the bonding pad 445 is now directly coupled to the junction capacitance of the reverse biased well/substrate junction. Since the well capacitance is situated directly beneath the bonding pad 445, there is minimal path resistance and inductance to prevent the spike energy from being shunted to the well capacitance, and to $V_{cc}$. After the spike passes and the gate is no longer forward biased, the JFET turns off, and the remaining charge stored on the well capacitance can be bled off through the trace 435 to the power supply.

For maximum speed in silicon, it is desirable that the JFET formed in a well be an n-channel device which has a higher majority carrier mobility than a p-channel device. Thus, in an embodiment of the present invention, a conventional p-type junction diode may be replaced by an intrinsically faster n-channel device in the ESD protection scheme of FIG. 3.

Figure 5:
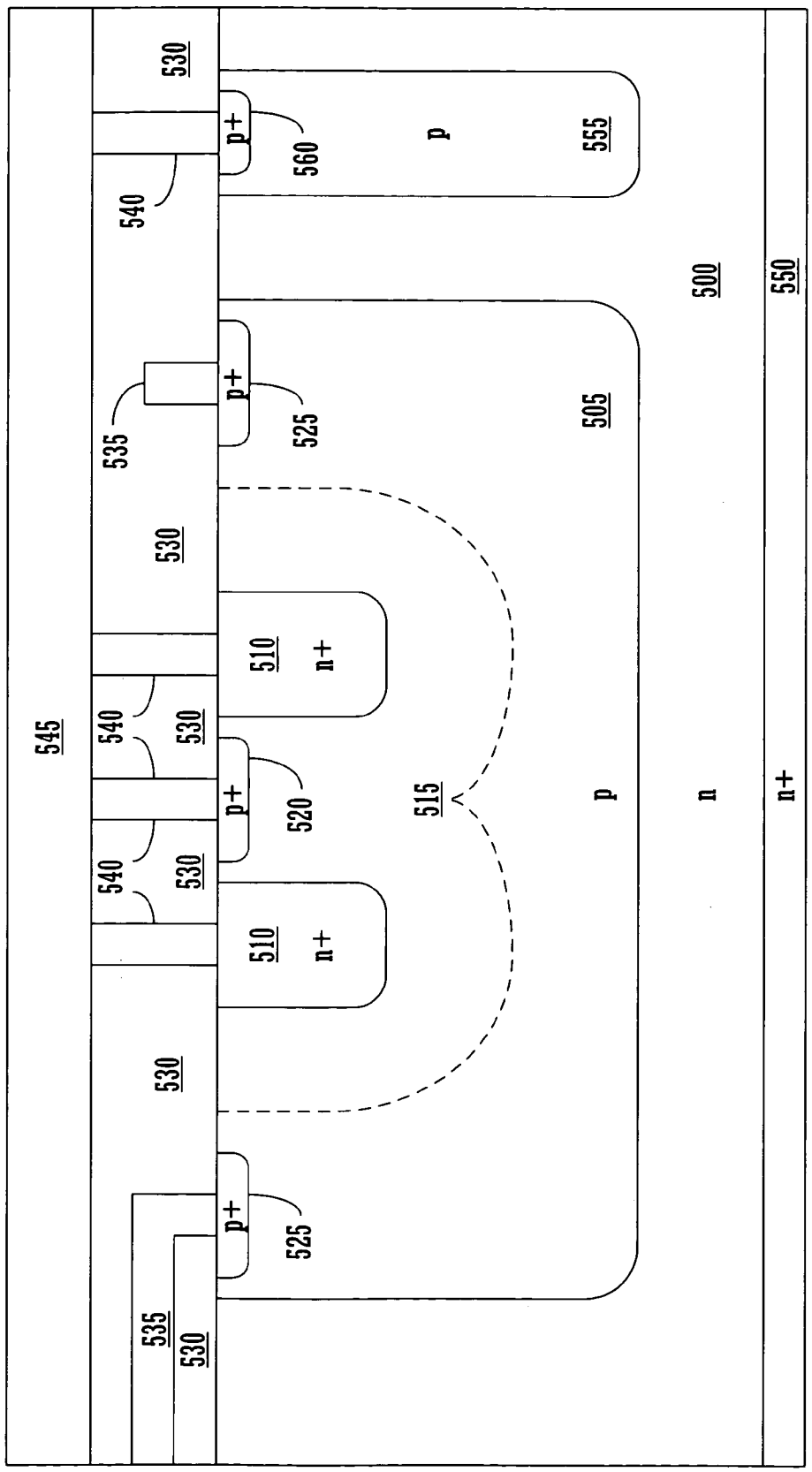
FIG. 5 shows a protection device comprising a p-channel enhancement mode junction field effect transistor (JFET) in accordance with an embodiment of the present claimed invention.

FIG. 5 shows protection device comprising a p-channel enhancement mode junction field effect transistor (JFET) similar to that of FIG. 4. A p-type well 505 is fabricated in an n-type substrate 500, such as silicon. Within the well 505, an n-type gate 510 is formed (e.g. by ion implant). A p+ drain contact 520 and a p+ source contact 525 are also formed in the well 505. the source contact 525 is coupled by conductive trace 535 to a current sink (e.g., a supply $V_{cc}$). The substrate 500 may include an optional n+ bottom contact 550.

A layer of dielectric 530 (e.g. silicon dioxide) provides support and partial electrical isolation for the interface bonding pad 545. The pad 545 is electrically coupled to the gate 510 and drain 520 by contact vias 540, and isolated from the remainder of the well 505. The contact vias 540 are preferably fabricated from a metal that provides an ohmic contact to the gate 510 and source 520.

The protection device of FIG. 5 also includes a second well 555 that provides a junction diode coupled to the pad 545 by a contact 560 and a contact via 540. As in the case of the second well diode in FIG. 4, the junction diode is optional, and may be underneath or outside of the pad 545.

Although an n-channel device may provide faster response, the use of a p-channel device allows the diode protection mode to be replaced by the switched transistor mode having a threshold voltage that is lower than the p-n junction forward voltage.

The protection levels in an integrated circuit can be set on a chip-by-chip or pad-by-pad basis through the independent selection of JFET type and threshold voltage. The gate geometry of an enhancement mode JFET associated with a bonding pad may be individually selected to provide a specific threshold voltage. The energy handling capability may be adjusted by sizing of the complementary well/substrate junction area.

Figure 6:
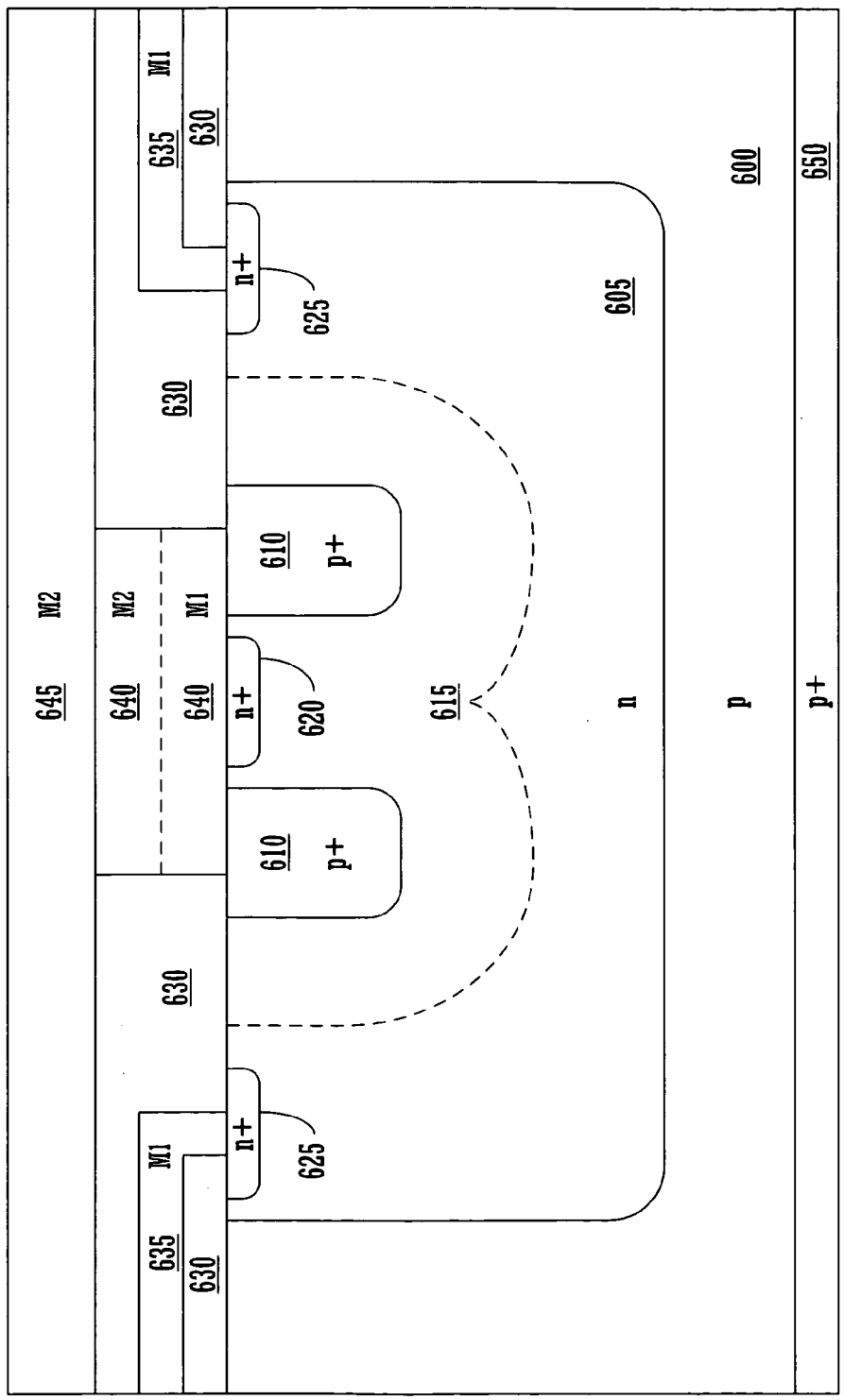
FIG. 6 shows an interface bonding pad with a low-inductance coupling to a JFET in accordance with an embodiment of the present claimed invention.

FIG. 6 shows an interface bonding pad with a low-inductance coupling to a JFET in accordance with an embodiment of the present claimed invention. The substrate 600, well 605, gate 610, drain contact 620, source contact 625, and bottom contact 650 are similar to the substrate 400, well 405, gate 410, drain contact 420, source contact 425, and bottom contact 450 of FIG. 4. However, the coupling between the bonding pad 645, drain 620 and gate 610 is quite different. Instead of the contact vias 440 shown in FIG. 4, the coupling in FIG. 6 is made by a blanket conductor 640. The blanket conductor is preferably a material, or combination of materials that establish an ohmic contact to the gate 610 and drain 620, while combining with the dielectric 630 to provide a robust support structure for the pad 645. Process constraints, electrical and mechanical considerations may all influence the use of contact vias, blanket contacts, or a combination of both.

Modern integrated circuits may have more than eight layers of interconnect metal separated by dielectric layers. Thus, the dielectric 630, trace 635, blanket 640, and pad 645 may be fabricated using material deposited during one or more processing steps associated with the interconnect fabrication of the integrated circuit. To minimize cost, it is desirable to fabricate the structure shown in FIG. 4 or FIG. 6 by appropriate selection of mask features in combination with the processing steps available during the normal processing of the integrated circuit.

In the example of FIG. 6, the trace 635 and the lower portion of the blanket 640 are fabricated using M1 layer metal, whereas the upper portion of the blanket 640 and the pad 645 are fabricated using M2 layer metal. Thus the trace 635, blanket 640 (or contact vias), and pad may be composite structures that are fabricated using more than one process step.

Figure 7:
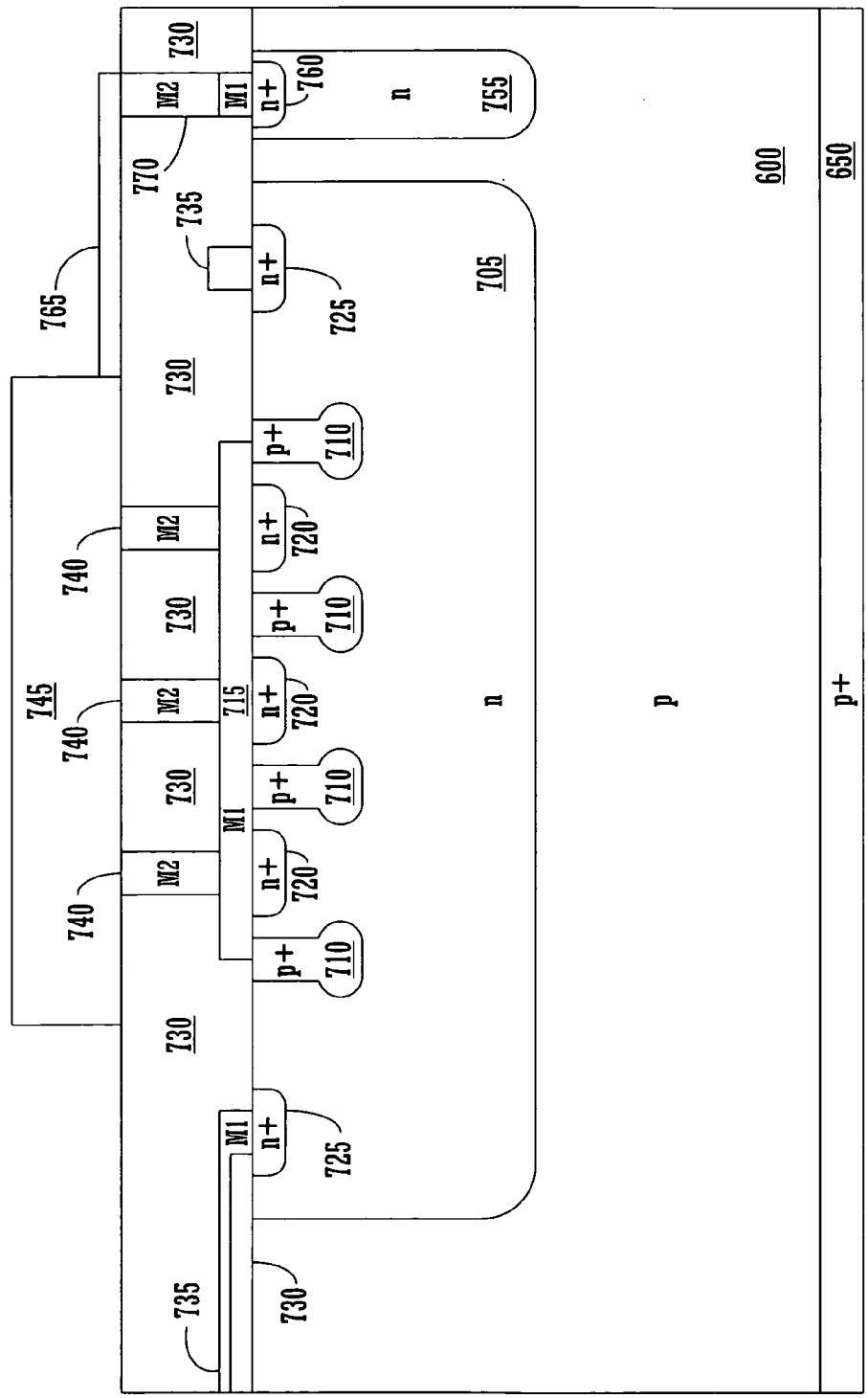
FIG. 7 shows a protection device comprising a gate grid structure in accordance with an embodiment of the present claimed invention.

FIG. 7 shows a JFET comprising a gate grid structure in accordance with an embodiment of the present claimed invention. An n-type well 705 is fabricated in a p-type substrate 700. The substrate 700 may include an optional p+ bottom contact 750.

Within the well 705 is a gate grid structure 710 source contact 725, and drain contacts 720. Since the threshold voltage is function of the gate geometry, the separation between elements of the gate cannot be arbitrary. The use of a grid structure allows for the on resistance of the JFET to be adjusted without altering the threshold voltage, by altering the number of cells in the grid.

When the gate 410 of a JFET such as shown in FIG. 4 is fabricated using a process optimized for the JFET, a single small device may provide the performance required for protection. However, when the JFET is fabricated using processes designed for other devices in the integrated circuit, a gate grid structure may be required. For example, the gate 710 may be implanted concurrently with another feature of the integrated circuit for which the p+ implant is optimized.

The bonding pad 745 of FIG. 7 is different from the bonding pad 445 of FIG. 4 in that it is smaller than the well over which it is formed. This embodiment provides a relatively larger well capacitance, and decreases the potential coupling between the pad 745, and the source contact 725, well 705, and trace 735. A smaller pad 745 may be adopted when the dielectric 730 and contact vias 740 are sufficiently strong to support the increased pressure that may be associated with a smaller bonding pad 745.

In the example of FIG. 7, the trace 735 and a blanket contact 715 are fabricated using M1 layer metal, whereas the contact vias 740 and the pad 745 are fabricated using M2 layer metal. The different structures (e.g., pad, contact vias, and blanket) shown in FIGS. 4 through 7 may be combined in many different ways, and composite structures may be fabricated using metal process layers other than M1 and M2.

The protection device of FIG. 7 may also include a second n-well 755 coupled to the pad 745 by a contact 760, contact via 770, and a trace 765. The junction diode formed between n-well 755 and substrate 700 and the JFET in well 705 provide ESD protection against negative and positive spikes. In this example, the second well is located outside of the bonding pad 745.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

We claim:

1. A semiconductor device comprising:
    a dielectric layer formed on a surface of a semiconductor substrate, wherein said dielectric layer comprises a portion disposed above an n-type well;
    a first interface bonding pad formed on a surface of said dielectric layer, wherein said bonding pad comprises a portion disposed above said n-type well;
    a first enhancement mode junction field effect transistor (JFET) comprising a first threshold voltage formed in said n-type well and disposed beneath said interface bonding pad, said JFET comprising a gate coupled to said interface bonding pad, a drain coupled to said interface bonding pad, and a source coupled to said p-type semiconductor substrate wherein said drain and said source are electrically coupled to said first interface bonding pad; and
    a source contact formed in said n-type well.

2. The semiconductor device of claim 1, further comprising a voltage source coupled to said source contact, wherein the potential of said voltage source is positive with respect to a p-type semiconductor substrate.

3. The semiconductor device of claim 2, wherein said p-type substrate is coupled to ground.

4. The semiconductor device of claim 1, wherein said drain and said gate are coupled by a conductor disposed on the surface of a p-type semiconductor substrate.

5. The semiconductor device of claim 1, wherein the surface perimeter of said n-type well is substantially confined by a perimeter of said interface bonding pad.

6. The semiconductor device of claim 1, wherein said gate comprises a gate grid structure.

7. The semiconductor device of claim 1, wherein the magnitude of said first threshold voltage is less than 0.5 volts.

8. A semiconductor device comprising:
    a dielectric layer formed on a surface of said semiconductor substrate, wherein said dielectric layer comprises a portion disposed above a p-type well;
    a first interface bonding pad formed on a surface of said dielectric layer, wherein said bonding pad comprises a portion disposed above said p-type well;
    a first enhancement mode junction field effect transistor (JFET) comprising first threshold voltage formed in said p-type well and disposed beneath said interface bonding pad, said JFET comprising a gate coupled to said interface bonding pad, a drain coupled to said interface bonding pad, and a source coupled to an n-type semiconductor substrate wherein said drain and said source are electrically coupled to said first interface bonding pad; and
    a source contact formed in said p-type well.

9. The semiconductor device of claim 8, further comprising a voltage source coupled to said source contact, wherein the potential of said voltage source is negative with respect to said n-type semiconductor substrate.

10. The semiconductor device of claim 9, wherein said n-type semiconductor substrate is coupled to ground.

11. The semiconductor device of claim 8, wherein said drain and said gate are coupled by a conductor disposed on the surface of said n-type semiconductor substrate.

12. The semiconductor device of claim 8, wherein the surface perimeter of said p-type well is substantially confined by a perimeter of said interface bonding pad.

13. The semiconductor device of claim 8, wherein said gate comprises a gate grid structure.

14. The semiconductor device of claim 8, wherein the magnitude of said first threshold voltage is less than 0.5 volts.

15. An integrated circuit comprising:
    a complementary well formed in the surface of a semiconductor substrate;
    a first vertical enhancement mode junction field effect transistor (JFET) formed in said complementary well, a source coupled to said semiconductor substrate, and a drain coupled to a gate, and a first threshold voltage; and
    a first interface bonding pad disposed above said JFET, wherein said first bonding pad is coupled to said gate and to said drain wherein said drain and said source are electrically coupled to said first interface bonding pad.

16. The integrated circuit of claim 15, wherein said first threshold voltage is less than 0.5 volts.

17. The integrated circuit of claim 15, further comprising a second JFET disposed beneath a second interface bonding pad, wherein said second JFET comprises a second threshold voltage that is different from the first threshold voltage.

18. The integrated circuit of claim 15, wherein said first JFET comprises a concurrently implanted gate.

* * * * *